(12) United States Patent
Geiss et al.

(10) Patent No.: US 7,538,004 B2
(45) Date of Patent: May 26, 2009

(54) METHOD OF FABRICATION FOR SIGE HETEROJUNCTION BIPOLAR TRANSISTOR (HBT)

(75) Inventors: Peter J. Geiss, Underhill, VT (US); Alvin J. Joseph, Williston, VT (US); Rajendran Krishnasamy, Essex Junction, VT (US); Xuefeng Liu, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/937,534

(22) Filed: Nov. 9, 2007

(65) Prior Publication Data

US 2008/0124882 A1    May 29, 2008

Related U.S. Application Data

(62) Division of application No. 10/711,482, filed on Sep. 21, 2004, now Pat. No. 7,317,215.

(51) Int. Cl.
*H01L 21/331* (2006.01)
(52) U.S. Cl. ............... 438/368; 438/342; 257/E21.372; 257/E21.608
(58) Field of Classification Search .................. 438/312, 438/338, 342, 368; 257/E21.327, E21.608
See application file for complete search history.

(56) References Cited

U.S. PATENT DOCUMENTS

| 5,177,583 | A | * | 1/1993 | Endo et al. ................... 257/190 |
| 5,656,514 | A | | 8/1997 | Ahlgren et al. |
| 6,686,250 | B1 | * | 2/2004 | Kalnitsky et al. ........... 438/345 |
| 6,967,144 | B1 | | 11/2005 | Sadovnikov |
| 7,135,721 | B2 | | 11/2006 | Toyoda et al. |
| 2003/0201461 | A1 | | 10/2003 | Sato et al. |

OTHER PUBLICATIONS

Zhao et al., "Analysis and Simulation of the Performance if Si/SiGe HBT's and Monolithic Integrated Preamplifiers of Photoreceivers", Proceedings of the SPIE (International Society for Optical Engineering) Conference, Sep. 18-19, 1998, vol. 3551, pp. 95-102.

* cited by examiner

*Primary Examiner*—Jerome Jackson, Jr.
*Assistant Examiner*—Paul A Budd
(74) *Attorney, Agent, or Firm*—Anthony J. Canale

(57) ABSTRACT

A heterojunction bipolar transistor is formed in a semiconductor substrate of a first conductivity type including a collector region. A base region is formed on the substrate and an emitter region is formed over the base region. At least one of the collector, base and emitter regions includes a first region doped with an impurity having a first concentration and a second region doped with the impurity having a second concentration. Noise performance and reliability of the heterojunction bipolar transistor is improved without degrading ac performance.

9 Claims, 3 Drawing Sheets

METHOD OF FABRICATION FOR SIGE HETEROJUNCTION BIPOLAR TRANSISTOR (HBT)

This application is a divisional of U.S. patent application Ser. No. 10/711,482, filed on Sep. 21, 2004 now U.S. Pat. No. 7,317,215.

FIELD OF THE INVENTION

The invention relates to semiconductor heterojunction bipolar transistors, and more particularly to a method of fabricating a SiGe heterojunction bipolar transistor in which the SiGe bipolar noise performance and reliability is substantially improved by reducing impurity concentrations near the emitter-base junction region.

BACKGROUND OF THE INVENTION

Significant growth in both high-frequency wired and wireless markets has introduced new opportunities where compound semiconductors such as SiGe have unique advantages over bulk complementary metal oxide semiconductor (CMOS) technology. With the rapid advancement of epitaxial-layer pseudomorphic SiGe deposition processes, epitaxial-base SiGe heterojunction bipolar transistors have been integrated with mainstream CMOS development for wide market acceptance, providing the advantages of SiGe technology for analog and RF circuitry while maintaining the full utilization of the advanced CMOS technology base for digital logic circuitry.

It is known to incorporate impurities into the various regions of SiGe heterojunction devices in order to improve device performance. For example, the emitter region is typically doped with arsenic (As) and the base region is typically doped with boron (B) in order to improve the ac performance (i.e. $f_T$, $f_{max}$) of the SiGe bipolar transistor.

The incorporation of carbon (C) into SiGe heterojunction devices has been carried out in the prior art to prevent the out-diffusion of boron from the base region. For example, it is known that the transient enhanced diffusion of boron is strongly suppressed in carbon-rich silicon layers; see, for example, H. J. Osten, et al., "Carbon Doped SiGe Heterojunction Bipolar Transistors for High Frequency Applications", IEEE BTCM 7.1, 109. Boron diffusion in silicon occurs via an interstitial mechanism and is proportional to the concentration of silicon self-interstitials. Diffusion of carbon out of the carbon-rich regions causes an under saturation of silicon self-interstitials. As a result, the diffusion of boron in these regions will be suppressed.

Efforts to further improve the ac performance of SiGe heterojunction devices include increasing impurity concentrations such as As in the emitter region and C in the base region. However, it has been observed that although ac performance improves with increasing As and C concentrations, the noise performance and reliability of SiGe heterojunction devices are degraded. The degradation in noise performance and reliability is due in part to the higher impurity concentrations resulting in an increased number of carriers near the emitter-base junction region.

In view of the SiGe bipolar performance problem mentioned above, there is a continued need for improving noise performance and reliability in SiGe bipolar devices having high impurity concentrations in the emitter and base regions.

SUMMARY OF THE INVENTION

An aspect of the invention is to provide a heterojunction bipolar transistor having improved noise performance and reliability without degrading ac performance.

Another aspect of the invention is to provide a heterojunction bipolar transistor comprising a semiconductor substrate of a first conductivity type including a collector region, a base region formed on the substrate and an emitter region formed over the base region. At least one of the collector, base and emitter regions includes a first region doped with an impurity having a first concentration and a second region doped with the impurity having a second concentration.

A further aspect of the invention is to provide a heterojunction bipolar transistor comprising a semiconductor substrate of a first conductivity type including a collector region; a base region formed on the substrate including a first base region doped with a non-dopant having a first concentration and a second base region doped with the non-dopant having a second concentration; and an emitter region formed over the base region including a first emitter region doped with a dopant having a first concentration and a second emitter region doped with the dopant having a second concentration.

A yet further aspect of the invention is to provide a method of fabricating a heterojunction bipolar transistor comprising the steps of providing a semiconductor substrate of a first conductivity type including a collector region; forming a base region on the substrate; forming an emitter region over the base region; doping a first region of at least one of the collector, base and emitter regions with an impurity having a first concentration; and doping a second region of said at least one of said collector, base and emitter regions with said impurity having a second concentration.

DETAILED DESCRIPTION OF THE INVENTION

Figure 1:
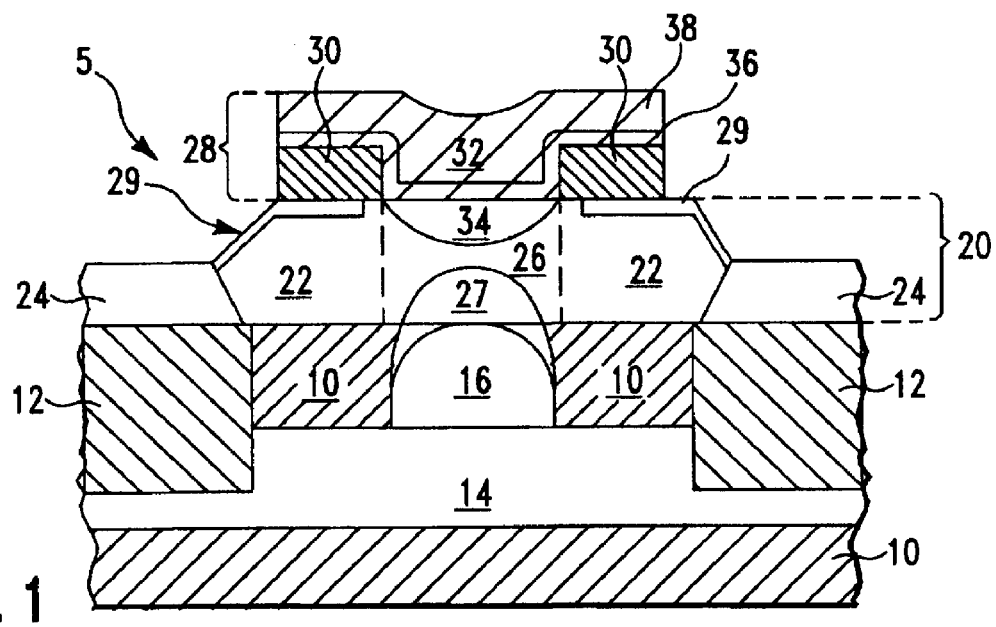
FIG. 1 is a cross-sectional view of the inventive SiGe heterojunction bipolar transistor.

The invention which is related to the use of low impurity concentrations close to the emitter-base junction region for improving SiGe noise performance and reliability will now be described in more detail by referring to FIGS. 1-7B and the discussion that appears hereinbelow. It is noted that in the drawings like and corresponding elements are referred to by like reference numerals. Also, for simplicity, only one bipolar device region is shown in the drawings. The bipolar device shown is exemplary and the invention is not limited to the bipolar device shown in the drawings. It is noted that the invention is applicable to improving the performance of transistors of numerous different designs. Other bipolar device regions as well as digital logic circuitry may be formed adjacent to the bipolar device region depicted in the drawings.

Before discussing the invention in detail, it is noted that the drawings depict an embodiment of the invention wherein the SiGe layer is formed with extrinsic base regions abutting the intrinsic base regions. In this embodiment the extrinsic base regions are formed by a non-selective epi deposition process. In addition to this embodiment, the invention also contemplates SiGe layers in which the extrinsic base regions are formed separately from the SiGe layer. Also, note that in the description that follows both the emitter and base regions have lower impurity concentrations closer to the emitter-base junction region compared to impurity concentrations farther away from the emitter-base junction region. The invention is however not limited to both emitter and base regions having low impurity concentrations close to the emitter-base junction. Instead, in the invention, at least one of the emitter and base regions includes a low concentration of impurity close to the emitter-base junction region and a high concentration of impurity farther away from the emitter-base junction region.

In the description that follows, the term "impurity" is used to refer to a "dopant" or "non-dopant" for incorporation into a semiconductor thin film. As utilized in this description, a "dopant" is an element which alters the equilibrium electron or hole concentration in an intrinsic semiconductor film. Dopant elements comprise, for example, boron (B), phosphorous (P) and arsenic (As). A "non-dopant" is an element that does not add to or subtract from the equilibrium carrier concentration in an intrinsic semiconductor film. Additionally, a non-dopant does not alter the density or location of states of the intrinsic semiconductor film. Non-dopant elements comprise, for example, carbon (C) and germanium (Ge). While an embodiment of the invention will be described in terms of incorporating a dopant, such as As, in an emitter region and a non-dopant, such as C, in a base region, other dopants and non-dopants could also be so incorporated into the emitter and base regions. Also, dopants and/or non-dopants could also be so incorporated into other regions of the SiGe bipolar transistor such as, for example, the collector region.

Reference is first made to FIG. 1 which represents a cross-sectional view of the inventive SiGe heterojunction bipolar transistor 5. Specifically, SiGe bipolar transistor 5 comprises semiconductor substrate 10 of a first conductivity type (N or P), sub-collector region 14 and collector region 16. Isolation regions 12 which are also present in the structure define the outer boundaries of the bipolar device region and serve to isolate the bipolar device region shown in FIG. 1 from adjacent device regions (not shown).

SiGe bipolar transistor 5 also includes SiGe base layer 20 formed on substrate 10 as well as on isolation regions 12. In accordance with the invention, the SiGe base layer includes polycrystalline Si regions 24 that are formed predominately over isolation regions 12, and single-crystal SiGe region 22, which includes extrinsic SiGe base regions 29, intrinsic SiGe base region 26, and collector-base junction region 27, also referred to in the art as the pedestal region of the device, formed predominately over sub-collector region 14. In accordance with an embodiment of the invention, the intrinsic SiGe base region 26 is doped with C, where the C concentration closer to the emitter-base junction region 34 is lower than the C concentration farther away from the emitter-base junction region 34. C profiles according to the invention will be described hereinafter with reference to FIGS. 7A-B. Note that the solid line separating each polycrystalline SiGe region from the single-crystal SiGe region is referred to in the art as a facet region.

SiGe bipolar transistor 5 also comprises emitter region 28 which includes patterned insulator layer 30 which has an emitter opening formed therein and a region of emitter polysilicon 32 formed on the patterned insulator layer as well as in the emitter opening. In accordance with an embodiment of the invention, the emitter polysilicon 32 is doped with As, where the As concentration closer to the emitter-base junction region 34 is less than the As concentration farther away from the emitter-base junction region 34. As profiles according to the invention will be described hereinafter with reference to FIGS. 7A-B. Note that after formation of the emitter polysilicon 32, dopant from the emitter polysilicon 32 is diffused into the intrinsic base region 26 forming emitter-base junction region 34.

Figure 2:
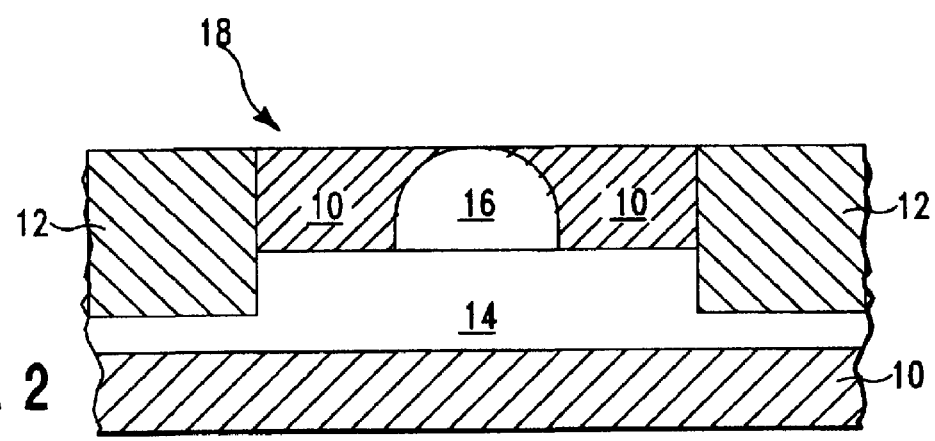
FIGS. 2-5 are cross-sectional views which shown the structure of FIG. 1 through various processing steps of the invention.

The method and various materials that are employed in forming SiGe bipolar transistor 5 shown in FIG. 1 will now be described in more detail. Reference is first made to FIG. 2 which shows the bipolar device region of an initial structure that is employed in the invention. The initial structure shown in FIG. 2 comprises substrate 10 having sub-collector region 14, collector region 16 and isolation regions 12 formed therein.

The structure shown in FIG. 2 is fabricated using conventional processing steps that are well known to those skilled in the art. Moreover, conventional materials that are also well known in the art are used in fabricating the same. For example, substrate 10 is composed of any semiconducting material including but not limited to: Si, Ge, SiGe, GaAs, InAs, InP and all other III/V compound semiconductors. Layered substrates comprising the same or different semiconducting material, e.g., Si/Si or Si/SiGe, are also contemplated herein. Of these semiconducting materials, it is preferred that substrate 10 be composed of Si. As mentioned above, the substrate may be an N-type substrate or a P-type substrate depending on the type of device to be subsequently formed.

Sub-collector region 14 is formed in, or alternatively on the substrate by using any well known technique that is capable of forming a sub-collector region in such a structure. Thus, the sub-collector region can be formed via implantation or by an epitaxial growth process. Note that the drawings depict a sub-collector region that is formed into the substrate via ion implantation. Isolations regions 12 are then formed by either using a conventional local oxidation of silicon (LOCOS) process or by utilizing lithography, etching and trench isolation filling.

Following the formation of isolation regions in the substrate, collector region 16 is then formed in bipolar device region 18 (between the two isolation regions 12 shown in FIG. 1) utilizing conventional ion implantation and activating annealing processes that are well known to those skilled in the art. For example, the activating annealing process is typically carried out at a temperature from about 900° C. to about 1000° C. for a time from about 5 seconds to about 60 seconds.

At this point of the inventive process, bipolar device region 18 may be protected by forming a protective material such as $Si_3N_4$ thereon, and conventional processing steps which are capable of forming adjacent device regions can be performed. After completion of the adjacent device regions and subsequent protection thereof, the inventive process continues. It should be noted that in some embodiments, the adjacent device regions are formed after completely fabricating the bipolar transistor.

Figure 3:
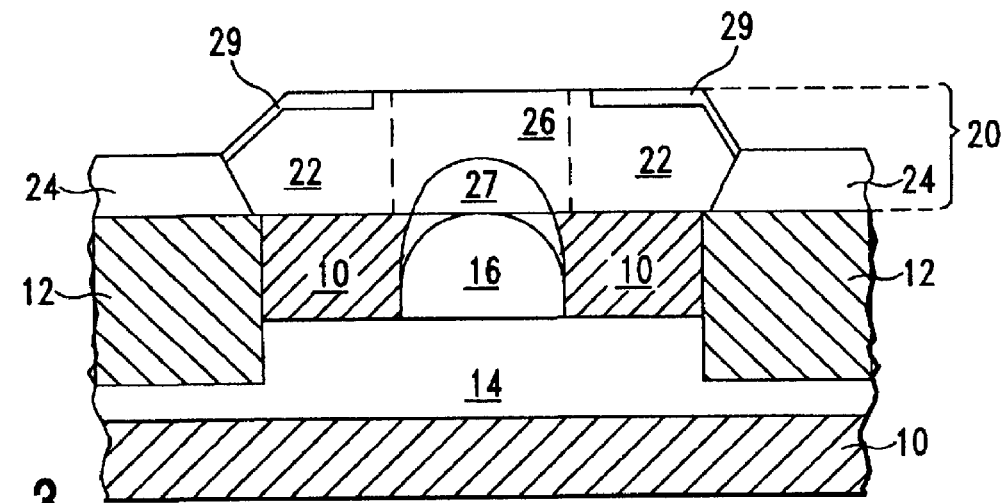

The next step of the invention is shown in FIG. 3. In this figure, SiGe layer 20 is formed on substrate 10 as well as on isolation regions 12. In accordance with an embodiment of the invention, SiGe layer 20 includes polycrystalline Si regions 24 that are formed predominately over isolation regions 12, and single-crystal SiGe region 22 that is formed predominately over sub-collector region 14. Single-crystal SiGe region 22 further includes extrinsic SiGe base regions 29 and intrinsic SiGe base region 26. Extrinsic SiGe base region 29 is an implanted region which can be formed by either a blanket ion implantation process or a combined patterning/ion implantation process. SiGe layer 20 is formed epitaxially utilizing a well-known deposition process including, but not limited to: ultra-high vacuum chemical vapor deposition (UHVCVD) and rapid thermal chemical vapor deposition (RTCVP). A boron-containing gas can be included in the deposition process to provide B in SiGe layer 20 in a preferred concentration of about $2 \times 10^{19}$ cm$^{-3}$ to about $2 \times 10^{20}$ cm$^{-3}$. In accordance with an embodiment of the invention, a carbon-containing material such as a carbon-containing gas source is introduced during the deposition process to form SiGe layer 20 (i.e. see commonly assigned U.S. Pat. No. 6,426,265 Chu et al., herein incorporated by reference in its entirety). The carbon-containing gas flow is varied to provide a C concentration in SiGe base region 26 that is lower closer to the subsequently formed emitter-base junction region 34 compared to farther away from emitter-base junction region 34. For example, a preferred C concentration of about $8 \times 10^{18}$ cm$^{-3}$ to about $5 \times 10^{19}$ cm$^{-3}$, preferably $1.5 \times 10^{19}$ cm$^{-3}$, is formed close to the emitter-base junction region 34 while a C concentration of about $1.5 \times 10^{19}$ cm$^{-3}$ to about $7 \times 10^{19}$ cm$^{-3}$, preferably $2.5 \times 10^{19}$ cm$^{-3}$, is formed farther away from the emitter-base junction region 34.

It is again emphasized that the invention is not limited to the embodiment wherein SiGe layer 20 is formed by epitaxial deposition. Note that when epi processes are employed, the SiGe layer is formed with extrinsic base regions abutting the intrinsic base region. The invention also contemplates cases wherein the extrinsic base regions are formed during the deposition of the SiGe layer utilizing the processes mentioned above.

An N-type dopant implant (not shown) may optionally be carried out in the pedestal, i.e., collector-base junction region 27, and/or collector region 16 at this point of the inventive method so as to form a device which operates at high-speeds. The optional N-type dopant implant is carried out using conventional processing techniques that are well known to those skilled in the art including, for example, ion implantation and activation annealing.

Figure 4:
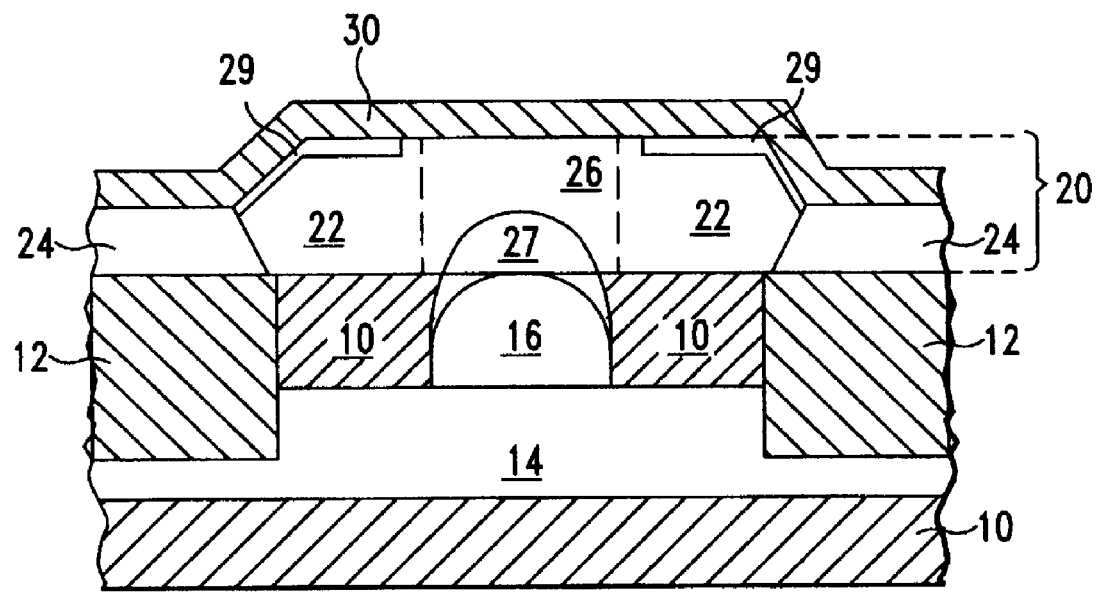

Next, and as shown in FIG. 4, an insulator layer 30 is formed on SiGe base layer 20 utilizing a conventional deposition process such as, for example, CVD, plasma-assisted CVD, chemical solution deposition and other like deposition processes. The insulator may be a single layer, as is shown in FIG. 4, or it may contain multi-insulator layers. Insulator layer 30 is composed of the same or different insulator material which is selected from the group consisting of $SiO_2$, Si oxynitride and other like insulators.

Figure 5:
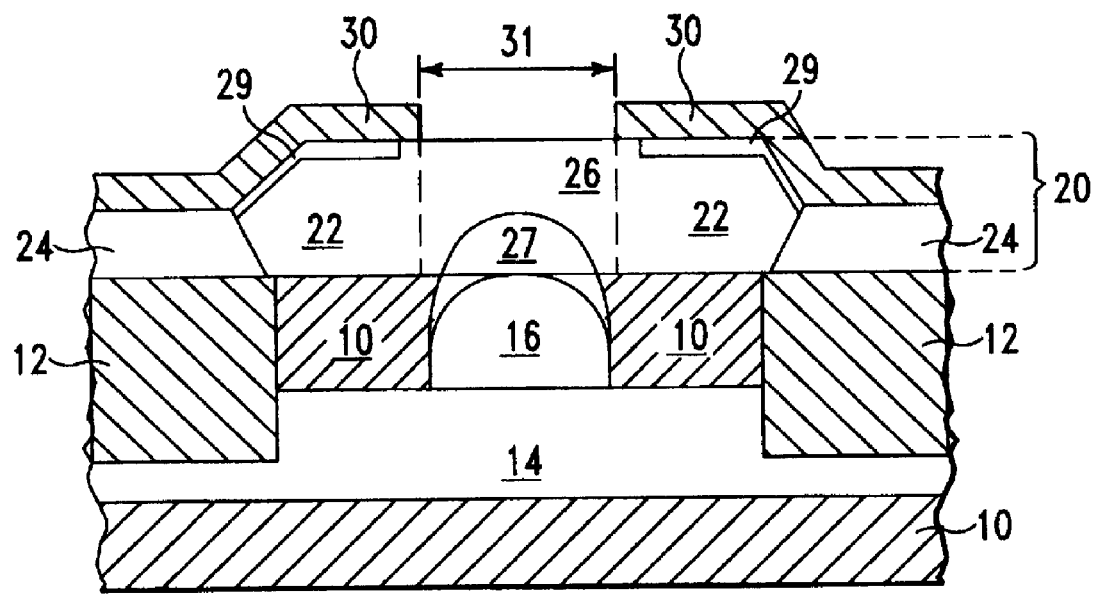

Emitter opening 31 is then formed in insulator layer 30 so as to expose a portion of intrinsic SiGe base region 26 as shown in FIG. 5. Emitter opening 31 is formed utilizing lithography and etching. The etching step used is selective in removing the insulator material as compared to the SiGe layer.

Following formation of emitter opening 31, emitter polysilicon layer 32 is formed on insulator layer 30 and in emitter opening 31 by utilizing a conventional deposition process such as CVD. In accordance with an embodiment of the invention, emitter polysilicon layer 32 is comprised of at least two layers of As doped polysilicon having different As concentrations. Polysilicon layer 36 has a lower As concentration than polysilicon layer 38. For example, polysilicon layer 36 is formed having a thickness of about 40 nanometers (nm) to about 90 nm and has an As concentration from about $5 \times 10^{19}$ cm$^{-3}$ to about $3 \times 10^{20}$ cm$^{-3}$, preferably about $1 \times 10^{20}$ cm$^{-3}$.

Polysilicon layer 38 is formed having a thickness of about 90 nm to about 130 nm and has an As concentration from about $1 \times 10^{20}$ cm$^{-3}$ to about $7 \times 10^{20}$ cm$^{-3}$, preferably about $5 \times 10^{20}$ cm$^{-3}$. The resulting As concentration in emitter region 28 is lower closer to the emitter-base junction region 34 compared to farther away from emitter-base junction region 34. Emitter polysilicon layer 32 and insulator layer 30 are then selectively removed so as to form emitter region 28 on intrinsic SiGe base region 26 (see FIG. 1). Specifically, lithography and etching are employed in forming the structure shown in FIG. 1. It is noted that a single etching process may be employed in removing portions of emitter polysilicon layer 32 and insulator layer 30, or separate etching steps may be employed in removing these layers.

Conventional BiCMOS processing steps may then be performed on the structure shown in FIG. 1.

Figure 6:
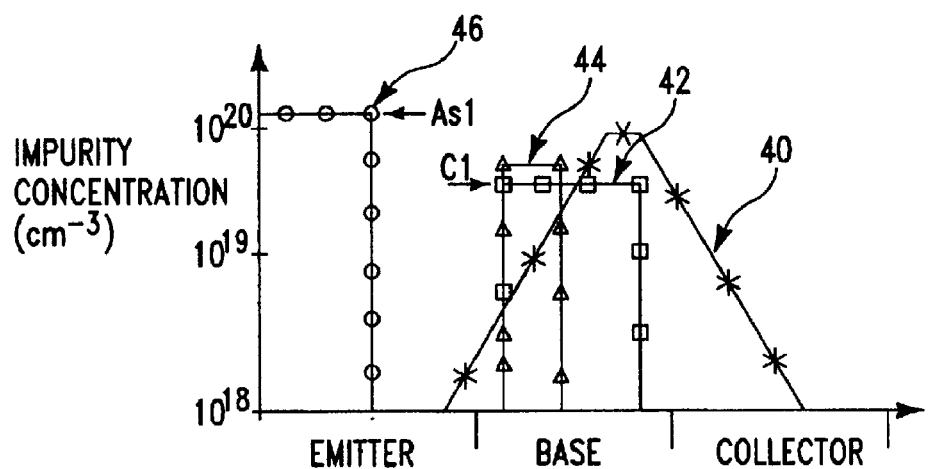
FIG. 6 is an impurity concentration profile of a conventional SiGe heterojunction bipolar transistor.
Figure 7A:
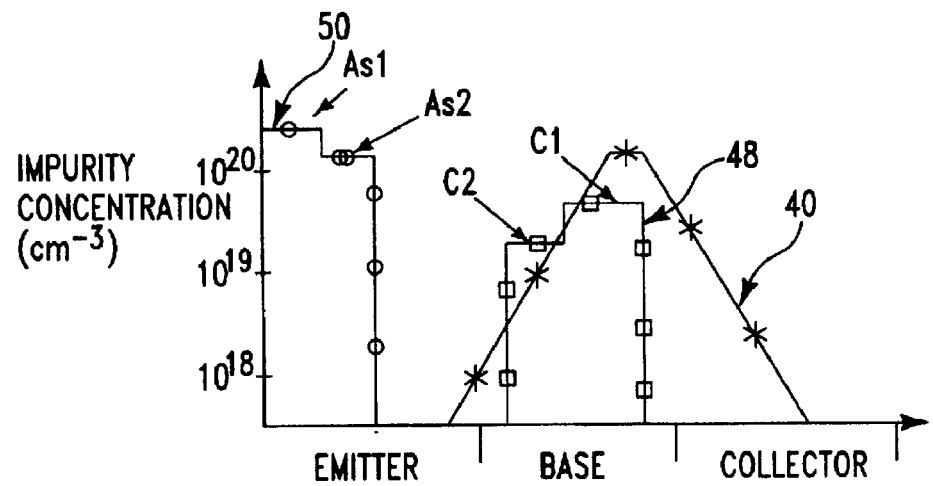
FIGS. 7A-B are impurity concentration profiles of various embodiments of the inventive SiGe heterojunction bipolar transistor.
Figure 7B:
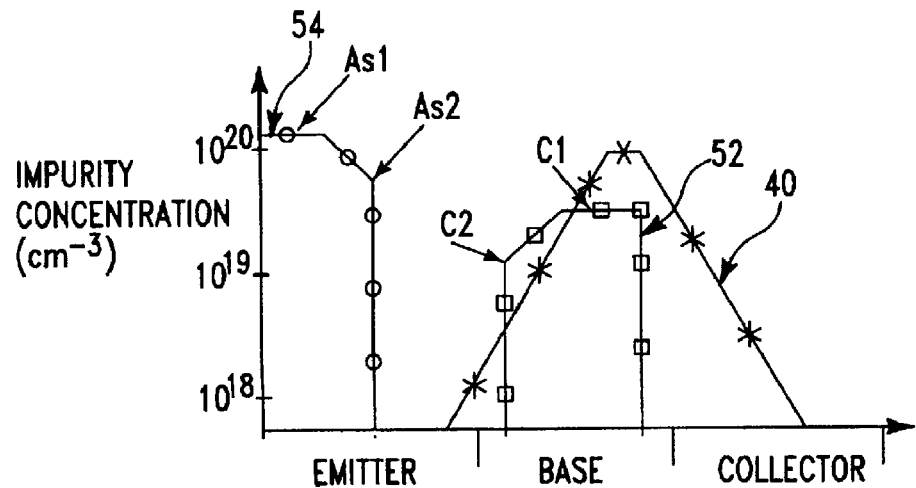

Impurity concentration profiles (hereinafter referred to as "impurity profiles") of the bipolar transistor shown in FIG. 1 will be discussed with reference to FIGS. 6, 7A-B. The impurity profiles shown in FIGS. 6, 7A-B are shown for "as-deposited" layers (i.e. SiGe base layer 20, emitter polysilicon layer 32) in order to more clearly illustrate embodiments of the invention. It is noted that it is well known to those skilled in the art that the impurity profiles will change due to diffusion of the impurities caused by subsequent processing such as, high temperature annealing, but will substantially maintain the general characteristics of the as-deposited impurity profiles shown in FIGS. 6, 7A-B (i.e. an as-deposited low concentration region will be less than a high concentration region even after an annealing step).

FIG. 6 shows conventional impurity profiles for a bipolar transistor such as SiGe bipolar transistor 5 shown in FIG. 1. Germanium (Ge) profile 40 corresponds to Ge in the SiGe base layer and B profile 44 corresponds to in-situ doped B (not shown) in the SiGe base layer. C profile 42 has a constant C concentration C1 in the intrinsic SiGe base region and As profile 46 has a constant As concentration As1 in the emitter region.

FIGS. 7A-B show inventive impurity profiles for C and As according to the bipolar transistor and method thereof as described with respect to FIGS. 1-5 (it is noted that B profile 44 is not shown in FIGS. 7A-B in order to more clearly illustrate C profiles 42 and 48). FIG. 7A shows C profile 48 having a concentration C1 in a first region of SiGe base region 26 and a concentration C2 in a second region of SiGe base region 26. Concentration C2 is less than concentration C1, and concentration C2 is formed closer to emitter-base junction region 34 than concentration C1. The transition in C concentration from C1 to C2 forms a "step profile" which can be formed by the method described hereinabove. For example, the amount of carbon-containing gas can be reduced relatively abruptly during the deposition process to provide the step change between C1 and C2. Likewise, As profile 50 having a concentration As1 in a first region of emitter region 28 and a concentration As2 in a second region of emitter region 28 is formed. Concentration As2 is less than concentration As1, and concentration As2 is formed closer to emitter-base junction region 34 than concentration As1. The transition in As concentration from As1 to As2 forms a "step profile" which can be formed by the method described hereinabove where polysilicon layer 36 provides concentration As2 and polysilicon layer 38 provides concentration As1.

Referring to FIG. 7B, C and As profiles having a gradual transition (i.e. "graded profile") between the low impurity concentration and the high impurity concentration regions are shown according to another embodiment of the invention. Graded C profile 52 can be formed, for example, by gradually reducing the amount of carbon-containing gas during the deposition process from the amount that provides concentration C1 to an amount that provides concentration C2. Since the amount of carbon-containing gas is gradually reduced, a graded C concentration profile is obtained. Regarding graded As profile 54, more than two layers of As doped polysilicon with different As concentrations can be deposited to form the graded profile between concentrations As1 and As2. For example, referring to the method described hereinabove, an As doped polysilicon layer having an As concentration greater than polysilicon layer 36 and less than polysilicon layer 38 can be formed between polysilicon layers 36, 38 to provide the graded As profile.

Although the inventive impurity profiles shown in FIGS. 7A-B have been described in terms of having low concentrations of both C and As (i.e. C2, As2) close to the emitter-base junction region 34, it is noted that the inventive bipolar transistor can also be formed with only one of the impurity profiles (i.e. C or As) having a low concentration close to the emitter-base junction region 34. Also, a combination of step and graded impurity profiles can be formed according to the invention. For example, C profile 52 and As profile 50 can be formed in a bipolar transistor, or C profile 48 and As profile 54 can be formed in a bipolar transistor.

It is noted that SiGe bipolar transistor 5 shown in FIG. 1 has improved SiGe bipolar noise performance and reliability because of the impurity profiles in the above identified regions, i.e., emitter and base regions. Note that it is possible to have improved SiGe bipolar noise performance when only one of the above-mentioned regions is formed having the impurity profiles described hereinabove. However, the greatest effect is observed when both the emitter and base regions include impurity profiles having low concentrations for each region formed close to the emitter-base junction region. In the invention, SiGe bipolar noise (i.e. 1/f noise) may be reduced by as much as about three orders of magnitude; therefore the invention provides an improved structure compared with prior art SiGe bipolar transistors which do not include stepped or graded profiles in the emitter and base regions. Further, the inventive bipolar transistor has substantially the same ac performance (i.e. $f_T$, $f_{max}$, Remitter, Rbase, Cbc, etc.) as prior art SiGe bipolar transistors.

Without wishing to be bound by any theory, it is believed that the low impurity concentrations (i.e. C2, As2 shown in FIGS. 7A-B) reduce interstitial concentrations in the emitter-base junction region thus reducing defects in this region which improves noise performance and reliability. Since the invention provides for high impurity concentrations (i.e. C1, As1 shown in FIGS. 7A-B) in the emitter and base regions, bipolar ac performance comparable to prior art bipolar transistors is achieved.

While this invention has been particularly shown and described with respect to embodiments thereof, it will be understood by those skilled in the art that the foregoing and other changes in forms and details may be made without departing from the spirit and scope of the invention. It is therefore intended that the invention not be limited to the exact forms and details described and illustrated, but fall within the scope of the appended claims.

What is claimed is:

1. A method of fabricating a heterojunction bipolar transistor comprising:
    providing a semiconductor substrate of a first conductivity type comprising a collector region;
    forming a base region on said substrate, said base region comprising a first base region doped with a non-dopant having a first concentration and a second base region doped with said non-dopant having a second concentration; and
    forming an emitter region over said base region, said emitter region comprising a first polysilicon layer in-situ doped with a dopant having a first concentration and a second polysilicon layer in-situ doped with said dopant having a second concentration.

2. The method of claim 1, wherein said first polysilicon layer is formed closer to an emitter-base junction region than said second polysilicon layer.

3. The method of claim 1, wherein said first concentration of said dopant is less than said second concentration of said dopant.

4. The method of claim 1, wherein said step of forming said emitter region comprises depositing said first polysilicon layer and said second polysilicon layer.

5. The method of claim 1 further comprising out-diffusing said dopant from at least one of said first and second polysilicon layers into said base region.

6. The method of claim 1, wherein said non-dopant comprises carbon.

7. The method of claim 1, wherein said first base region is formed closer to an emitter-base junction region than said second base region.

8. The method of claim 1, wherein said step of forming said first and second regions of said base region comprises:
    incorporating said non-dopant in a gas phase in a deposition process; and
    varying an amount of said non-dopant gas during said deposition process to provide said first and second concentrations.

9. The method of claim 1, wherein said first concentration of said non-dopant is less than said second concentration of said non-dopant.

* * * * *